United States Patent [19]

Inoue et al.

[11] Patent Number: 5,081,064
[45] Date of Patent: Jan. 14, 1992

[54] METHOD OF FORMING ELECTRICAL CONTACT BETWEEN INTERCONNECTION LAYERS LOCATED AT DIFFERENT LAYER LEVELS

[75] Inventors: Minoru Inoue, Kawasaki; Ryuji Iwama, Kuwana, both of Japan

[73] Assignee: Fujitsu Limited, Kawasaki, Japan

[21] Appl. No.: 532,709

[22] Filed: Jun. 4, 1990

[30] Foreign Application Priority Data

Jun. 6, 1989 [JP] Japan ................... 1-143395

[51] Int. Cl.[5] ............................................. H01L 21/44
[52] U.S. Cl. .................................. 437/190; 437/194; 437/195; 437/189; 357/68; 357/71
[58] Field of Search ............. 437/190, 194, 195, 189; 357/68

[56] References Cited

U.S. PATENT DOCUMENTS

| | | | |
|---|---|---|---|
| 4,107,726 | 8/1978 | Schilling | 357/715 |
| 4,507,852 | 4/1985 | Karulkar | 29/590 |
| 4,937,652 | 6/1990 | Okumura et al. | 357/71 |
| 4,952,521 | 8/1990 | Goto | 437/192 |
| 4,962,414 | 10/1990 | Liou et al. | 437/189 |
| 4,983,543 | 1/1991 | Sato et al. | 437/192 |
| 4,998,157 | 3/1991 | Yokoyama et al. | 437/189 |

FOREIGN PATENT DOCUMENTS 0310108 4/1989 European Pat. Off. ............ 437/200

OTHER PUBLICATIONS

IBM Technical Disclosure Bulletin, vol. 24, No. 9, Feb. 1982, New York, US, p. 4740, M. Shatzkes & A. Sugerman: "Via Hole Contact Resistance Yield Improvement" the whole document.

*Primary Examiner*—Brian E. Hearn
*Assistant Examiner*—Laura M. Holtzman
*Attorney, Agent, or Firm*—Armstrong, Nikaido, Marmelstein, Kubovcik & Murray

[57] ABSTRACT

A method of forming an electrical contact between interconnection layers located at different layer levels includes the steps of forming a contact hole in an interlayer insulating film, and forming a metallic intermediate layer on an exposed surface portion of a first conductive interconnection layer and the interlayer insulating film. Then, a portion of said metallic intermediate layer exposed through said contact hole and an oxide film formed on said surface portion of the first conductive interconnection layer are eliminated by an etching process. This process is carried out in a vacuum. After that, in the vacuum, a second conductive interconnection layer is formed in said contact hole and formed on said interlayer insulating film so that an electrical contact between said first and second conductive interconnection layers are formed.

16 Claims, 4 Drawing Sheets

FIG. IA PRIOR ART
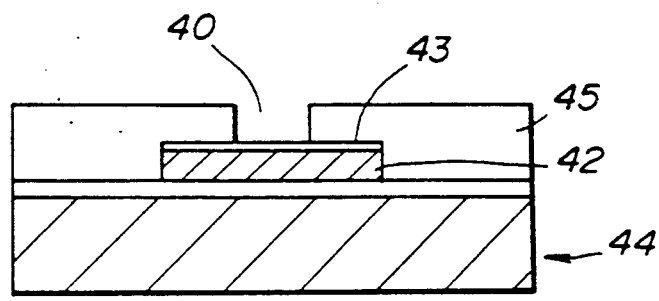
FIG. IB PRIOR ART
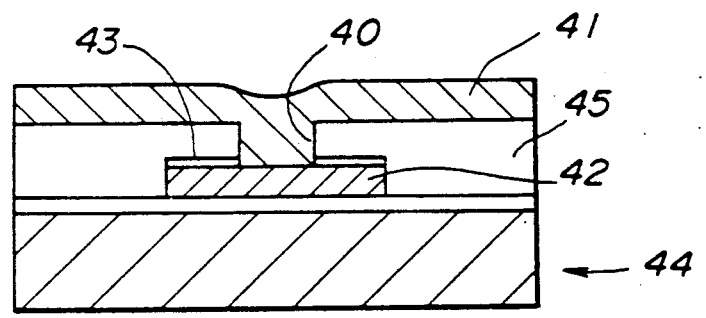
FIG. IC PRIOR ART
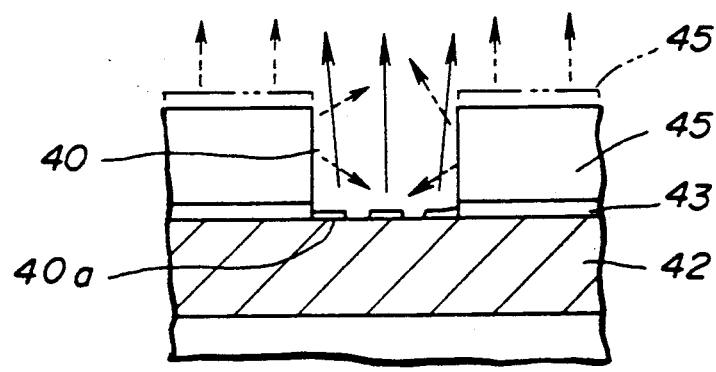

METHOD OF FORMING ELECTRICAL CONTACT BETWEEN INTERCONNECTION LAYERS LOCATED AT DIFFERENT LAYER LEVELS

BACKGROUND OF THE INVENTION

The present invention generally relates to a method of forming a semiconductor layer structure, and more particularly to a method of forming an electrical contact between interconnection (wiring) layers located at different layer levels.

Recently, there has been considerable progress in the development of a sub-micron scale semiconductor device. This remarkable advance in the field of semiconductor devices has, however, encountered unexpected problems.

A decrease in the size of interconnection lines (feature size) decreases the size of a bottom portion of a via contact hole (hereinafter simply referred to a contact hole) for connecting interconnection (wiring) layers located at different layer levels. In addition, the size of the bottom portion of the contact hole is further reduced due to the fact that the material of an interconnection layer is deposited in the contact hole by sputtering. That is, when an aspect ratio (which is a ratio of the depth of a contact hole to the diameter thereof) is great, coverage is deteriorated due to the shadow effect. As is well known, the contact resistance increases with a decrease in the size of a contact which realizes an electrical connection. For this reason, an increase in the contact resistance is a serious problem which must be overcome.

Aluminum is widely used for forming interconnection layers since it is less expensive and has a low resistivity. However, when aluminum is exposed to oxygen and/or water vapor in the air during a time when an interconnection layer is formed, a natural oxide film is easily formed on the surface of the Al interconnection layer. The presence of the natural oxide film on the Al interconnection layer causes an increase in resistance of the Al interconnection layer. When the natural oxide film on the Al interconnection layer is formed in a contact hole having a great aspect ratio, the contact resistance becomes greater than an expected value. From the above-mentioned points of view, there is a need for a method of easily eliminating the natural oxide film on the Al interconnection layer.

Referring to FIGS. 1A and 1B, a conventional method of forming a multilevel interconnection layer structure will now be described. A contact hole 40 is formed in an interlayer insulating film 45 on an Al interconnection layer 42 located at a lower layer level. The interlayer insulating film 45 is made of silicon dioxide ($SiO_2$), a phosphosilicate glass (PSG) or the like. Then an Al interconnection layer 41 at an upper layer level is grown, as shown in FIG. 1B. In order to realize a good electrical contact between the Al interconnection layers 41 and 42, it is necessary to eliminate a natural oxide film 43 in its entirety from the surface of the Al interconnection layer 42 at the lower layer level.

Conventionally, a dry etching process using argon (Ar) gas is used for eliminating the natural oxide film 43. After eliminating the natural oxide film 43, the upper-layer-level Al interconnection layer 42 is successively grown without exposing a wafer 44 to air so that the Al interconnection layer 42 at the lower layer level is prevented from being oxidized again.

A surface treatment by use of dry etching is carried out for eliminating the natural oxide film 43 on the surface of the Al interconnection layer 42 in its entirety. In actuality, not only the surface of the Al interconnection layer 42 but also the surface of the interlayer insulating film 45 are simultaneously etched. In this case, the following problems take place due to the fact that $SiO_2$ or the like such as $SiO_2$ or PSG is etched.

First, $SiO_2$ materials or the like are scattered, by etching, onto internal elements such as a shield and so on in an etching chamber (not shown). These internal elements are formed of stainless steel or aluminum, which has a thermal expansion ratio different from that of $SiO_2$ or the like. Thus, adhesion between $SiO_2$ or the like and the internal elements is not good. For this reason, $SiO_2$ materials or the like comes off the internal elements, and particles of $SiO_2$ or the like are generated in the etching chamber.

Second, as the aspect ratio increases, it becomes difficult for $SiO_2$ materials or the like 40a (FIG. 1C) which comes off an inner wall of the contact hole 40 to fly out of the contact hole 40. Thus, $SiO_2$ materials or the like 40a are deposited on the exposed surface of the Al interconnection layer 42. The presence of $SiO_2$ or the like 40a on the exposed surface of the Al interconnection layer 42 causes the exposed surface to be oxidized again or causes a change in quality thereof. This deteriorates the electrical contact between the Al interconnection layers 41 and 42. The two-dotted chain lines in FIG. 1C represent the original surface before $SiO_2$ or the like is scattered.

SUMMARY OF THE INVENTION

It is a general object of the present invention to provide an improved method of forming an electrical contact between interconnection layers at different layer levels in which the above-mentioned disadvantages are eliminated.

A more specific object of the present invention is to provide a method in which the natural oxide film in the contact hole is eliminated in its entirety while preventing the occurrence of $SiO_2$ particles or the like.

The above-mentioned objects of the present invention are achieved by a method of forming an electrical contact between interconnection layers located at different layer levels, comprising the steps of:

a) forming a first conductive interconnection layer on an insulating film on a semiconductor substrate;

b) depositing an interlayer insulating film on the first conductive interconnection layer and the insulating film;

c) forming a contact hole in the interlayer insulating film, a surface portion of the first conductive interconnection layer being exposed through the contact hole;

d) forming a metallic intermediate layer on the surface portion of the first conductive interconnection layer and the interlayer insulating film;

e) eliminating, by an etching process, a portion of the metallic intermediate layer exposed through the contact hole and an oxide film formed on the surface portion of the first conductive interconnection layer; and f) forming a second conductive interconnection layer in the contact hole and on the interlayer insulating film so that an electrical contact between the first and second conductive interconnection layers is formed, wherein said steps (a) through (f) are carried out in this order and said steps (e) and (f) are successively carried out in a vacuum.

BRIEF DESCRIPTION OF THE DRAWINGS

Other objects, features and advantages of the present invention will become apparent from the following detailed description when read in conjunction with the accompanying drawings, in which:

FIGS. 1A, 1B and 1C are elevational sectional views illustrating a conventional production method;

DESCRIPTION OF THE PREFERRED EMBODIMENT

Figure 2A:
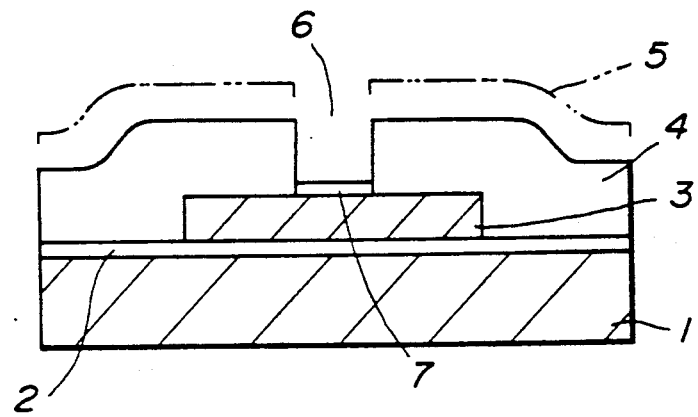
FIGS. 2A, 2B, 2C and 2D are elevational sectional views illustrating a method according to a preferred embodiment of the present invention.

A description will now be given of a method according to a preferred embodiment of the present invention. Referring to FIG. 1A, an $SiO_2$ insulating film 2 is formed on a silicon substrate 1. Next, an Al interconnection layer 3 at the lower layer level is deposited to a thickness between 0.5 μm and 1 μm on the $SiO_2$ film 2. Then, an interlayer insulating film 4 made of PSG, $SiO_2$ or silicon nitride ($Si_3N_4$) is deposited to a thickness of about 1.2 μm. After that, a reactive ion etching is carried out where a resist film 5 serves as a mask. Thereby, a contact hole 6 having a width of about 1.2 μm is formed in the interlayer insulating film 4. In this state, an oxide film (aluminum oxide film) 7 is naturally deposited to a thickness between 10 and 100 angstroms on an exposed surface of the Al interconnection layer 3 at the lower layer level. An aluminum oxide layer (not shown) on the other surface portion of the interconnection layer 3 is in contact with the interlayer insulating film 4 may be oxidized.

Figure 2B:
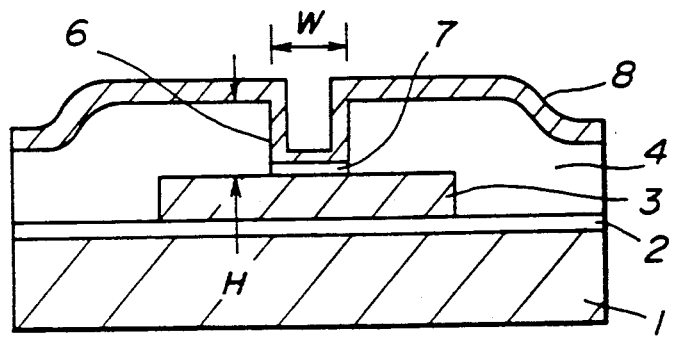
Figure 2C:
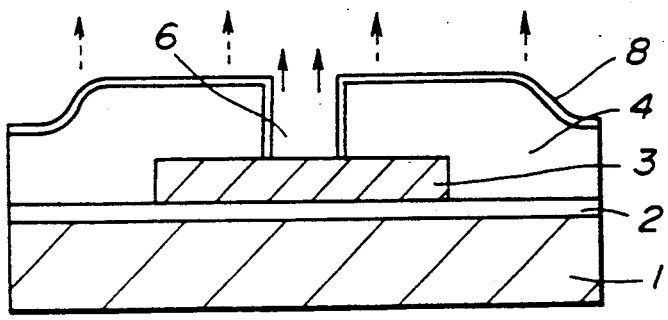

As shown in FIG. 2B, an intermediate layer 8 having a thickness between 50 and 200 angstroms is formed on the entire surface. The intermediate layer 8 is formed of a metallic material which is easily bonded to oxygen, such as titanium (Ti), aluminum (Al) or an alloy of Ti and Al. Such a material is deposited by, for example, a sputtering process or a vacuum evaporation process. In a sputtering process, a sputtering chamber (not shown) having a reduced pressure of 3mmTorr is supplied with argon, and a direct current power of 0.2 kW is applied to a target during a period of time between 10 and 40 seconds.

Figure 3:
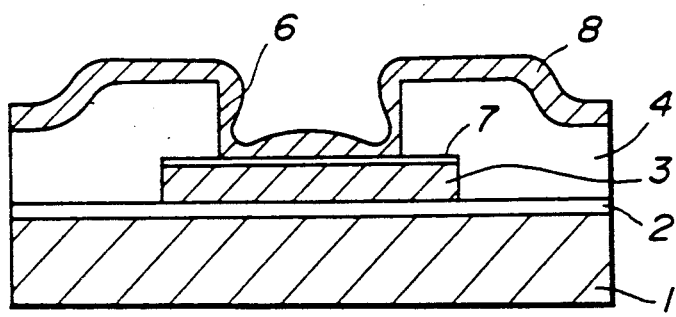
FIG. 3 is an elevational sectional view illustrating the layered state of an intermediate layer in a contact hole.

During the procedure of forming the intermediate layer 8, it is difficult for a metallic element to be deposited on the bottom of the fine contact hole 6 due to the shadow effect. For this reason, the coverage shape of the intermediate layer 8 changes, depending on the relative size of the contact hole 6 (aspect ratio). When the aspect ratio of the contact hole 6 (which is a ratio of the height H to the width W thereof) is small, the intermediate layer 8 is unevenly deposited on the exposed surface of the Al interconnection layer 3, as shown in FIG. 3. In some cases, a portion of the intermediate layer 8 in the contact hole 6 has a maximum thickness which is approximately equal to the thickness of the interlayer insulating film 4.

On the other hand, when the width W is approximately equal to 1.2 μm so that the aspect ratio is great, a portion of the intermediate layer 8 formed on the bottom of the contact hole 6 is evenly formed and has a thickness less than ½ the thickness of another portion thereof other than the above portion.

Next, the silicon substrate 1 is placed in the etching chamber (not shown) which is maintained in a vacuum state. Then an RF etching process is carried out for the silicon substrate 1 in the etching chamber. During the RF etching process, argon ions are projected onto the intermediate layer 8 formed on the entire surface of the interlayer insulating film 4 and on the inner portion of the contact hole 6. The silicon substrate 1 is supplied with a strong electrical field which orients argon ions perpendicularly. Due to the presence of the strong electrical field, argon ions in a sputter etching are perpendicularly projected onto the metallic layer 8 even when the contact hole 6 is fine or has a high aspect ratio. Thus, it becomes possible to prevent oxide materials, or particles from bounding on the inner wall of the contact hole 6 due to the shadow effect which takes place during the process of sputtering the intermediate layer 8.

As a result of the above-mentioned process, it becomes possible to uniformly etch the entire intermediate layer 8 irrespective of its position. Thus, it becomes possible to eliminate the entire portion of the intermediate layer 8 and the entire aluminum oxide film 7 located in the contact hole 6 and to eliminate a part of the surface portion of the intermediate layer 8 other than the above portion thereof in the contact hole 6. That is, the intermediate layer 8 remains on the interlayer insulating film 4, while the intermediate layer 8 and the aluminum oxide film 8 in the contact hole 6 are completely eliminated.

In the above-mentioned etching process, the intermediate film 8 formed of titanium and the Al interconnection layer 3 are etched at etching rates of 200 Å/min and 250 Å/min, respectively, when the amount of Ar gas is 200 SCCM, the pressure is 7mmTorr and RF power of 400 W is applied to the electrode. As is well known, two different types of etching devices are available, one being of a cathode-coupled type, and the other being of an anode-coupled type. In the cathode-coupled type, RF power is applied to the substrate to be etched. In the anode-coupled type, RF power is applied to the anode opposite to the substrate. It is possible to eliminate the oxide film on the bottom of the contact hole 6 by either one of the two types of etching devices.

During the above-mentioned etching process, Ar ions hit a peripheral portion of the intermediate layer 8 around the contact hole 6. Thus, there is a possibility that metallic elements will be emitted from the above peripheral portion of the intermediate layer 8 and deposited on the exposed surface of the Al interconnection layer 3 at the lower layer level. It will be noted that there is no problem arising from the deposition of emitted metallic elements because the emitted metallic elements have conductivity.

Since the intermediate layer 8 is formed of a material which is easily bonded to oxygen, the aluminum oxide film 7 on the surface of the Al interconnection layer 3 is dioxidized by the metallic material of the intermediate layer 8. Thus, it becomes possible to extinguish the aluminum oxide film 7 by eliminating only the intermediate layer 8. Particularly, this is possible greatly when the silicon substrate 1 is heated before plasma etching (sputter etching). That is, the heat treatment facilitates deoxidation of the aluminum oxide film 7 by the intermediate layer 8.

Figure 2D:
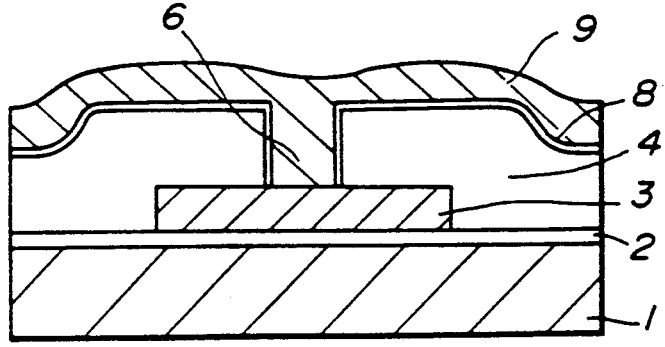

After that, as shown in FIG. 2D, pure Al or Al-Si (aluminum containing silicon) is deposited on the intermediate layer 8 and in the contact hole 6 by sputtering so that an Al interconnection layer 9 at the upper layer level is formed to a thickness of about 1 μm. For example, a target of Al-Si (Al containing Si by 1 wt %) is used and the pressure of Ar gas, D.C. power and the film growth time are set to 3 mmTorr, 6.0 kW and 40–60 seconds, respectively. It will be noted that the interconnection layers 3 and 9 is limited to pure Al or Al-Si. Alternatively, each of the interconnection layers 3 and 9 can be comprised of aluminum and copper, aluminum, titanium and copper, or aluminum, titanium and silicon.

Figure 4A:
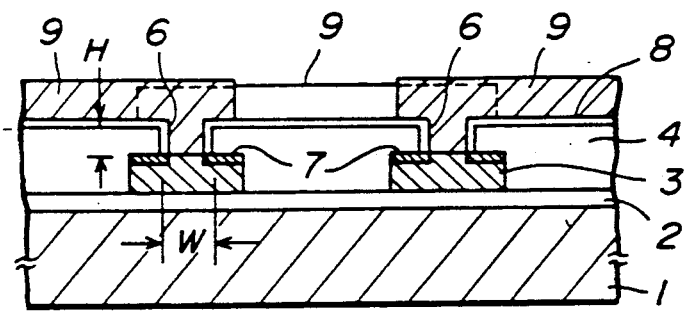
FIGS. 4A and 4B are respectively elevational sectional and plan views used in the experiments.
Figure 4B:
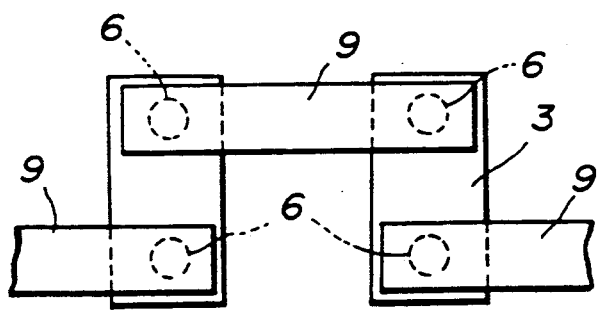

A description will now be given of an electrical contact between the Al interconnection layers 3 and 9 which are formed by the above-mentioned method. In the experiments, a chain contact as shown in FIGS. 4A and 4B was used in which a plurality of Al interconnection layers 9 at the upper layer level and a plurality of Al interconnection layers 3 were alternately connected to each other through the contact holes 6. The height H and width W of each contact hole 6 were set to 1.2 μm. The resistance of a chain contact consisting of 50,000 contact holes formed by the aforementioned conventional method using no intermediate layer 8 was equal to 50 kΩ. On the other hand, the resistance of a chain contact consisting of 50,000 contact holes formed according to the present invention using the intermediate layer 8 was equal to 10 k . According to the conventional method, SiO2 particles or the like were observed in the etching device when 100 sheets of substrate were processed. On the other hand, according to the present invention, 500 sheets of substrate could be processed while no SiO2 particles were observed.

Figure 5:
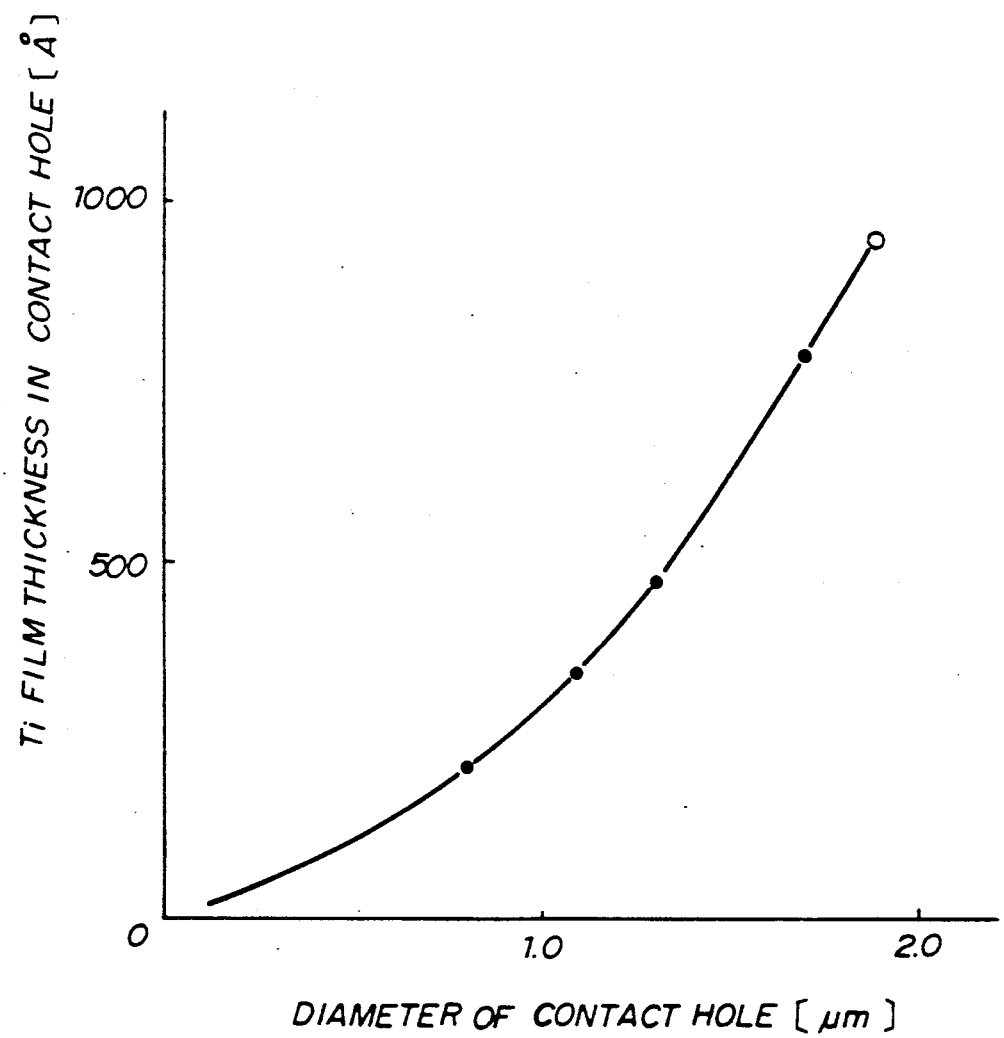
FIG. 5 is a graph illustrating the relationship between the thickness of a portion of the intermediate layer in a contact hole and the diameter of the contact hole.

FIG. 5 is a graph illustrating the relationship between the thickness of the Ti intermediate layer 8 on the bottom of the contact hole 6 and the diameter of the contact hole 6. The graph was obtained under the condition where the Ar gas pressure and the power were approximately equal to 3 mmTorr and 4 kW, respectively. The Ti intermediate layer 8 in the contact hole 6 was approximately 950 angstroms thick. It can be seen from the graph of FIG. 5 that the film thickness of the Ti intermediate layer observed in the contact hole 6 increases with an increase in the diameter of the contact hole 6.

The present invention is not limited to the specifically described embodiment, and variations and modifications may be made without departing from the scope of the present invention.

What is claimed is:

1. A method of forming an electrical contact between interconnection layers located at different layer levels, comprising the steps of:
   a) forming a first conductive interconnection layer on an insulating film on a semiconductor substrate;
   b) depositing an interlayer insulating film on said first conductive interconnection layer and said insulating film;
   c) forming a contact hole in said interlayer insulating film, wherein a surface portion of said first conductive interconnection layer is exposed through said contact hole;
   d) forming a metallic intermediate layer on said surface portion of the first conductive interconnection layer and said interlayer insulating film, said metallic intermediate layer having a first portion on said first conductive interconnection layer and a second portion on said first interlayer insulating film, wherein said first portion is thinner than said second portion;
   e) etching said metallic intermediate layer wherein said first portion and an oxide film naturally formed on said surface portion of said first conductive interconnection layer are removed from a bottom of said contact hole and said second portion is left on said interlayer insulating film; and
   f) forming a second conductive interconnection layer in said contact hole and on said second portion of said metallic intermediate layer wherein an electrical contact between said first and second conductive interconnection layers is formed,
   wherein said steps of etching said metallic intermediate layer, and forming the second conductive interconnection layer are successively carried out in a vacuum.

2. A method as claimed in claim 1, wherein said metallic intermediate layer comprises a metallic material which is easily bonded to oxygen.

3. A method as claimed in claim 1, wherein said metallic intermediate layer comprises titanium.

4. A method as claimed in claim 1, wherein said metallic intermediate layer comprises aluminum.

5. A method as claimed in claim 1, wherein said metallic intermediate layer comprises an alloy of titanium and aluminum.

6. A method as claimed in claim 1, wherein said step (d) comprises the step of forming said metallic intermediate layer by a sputtering process.

7. A method as claimed in claim 1, wherein said step (d) comprises the step of forming said metallic intermediate layer by a vacuum evaporation process.

8. A method as claimed in claim 1, wherein said etching process used in said step (e) is a sputter etching process.

9. A method as claimed in claim 1, further comprising the step of heating said semiconductor substrate before said step (e) is carried out.

10. A method as claimed in claim 8, wherein said sputter etching is carried out by projecting argon ions onto said metallic intermediate layer in a state where an electrical field orienting said argon ions is applied to said semiconductor substrate.

11. A method as claimed in claim 1, wherein said electrical field is oriented perpendicularly to said semiconductor substrate.

12. A method as claimed in claim 1, wherein each of said first and second conductive interconnection layers comprises pure aluminum.

13. A method as claimed in claim 1, wherein each of said first and second conductive interconnection layers comprises aluminum and silicon.

14. A method as claimed in claim 1, wherein each of said first and second conductive interconnection layers comprises aluminum and copper.

15. A method as claimed in claim 1, wherein each of said first and second conductive interconnection layers comprises aluminum, titanium and copper.

16. A method as claimed in claim 1, wherein each of said first and second conductive interconnection layers comprises aluminum, titanium and silicon.

* * * * *